(12) United States Patent
Kudo et al.

(10) Patent No.: US 10,920,311 B2
(45) Date of Patent: Feb. 16, 2021

(54) DEPOSITION MASK, METHOD FOR MANUFACTURING THE SAME, AND METHOD FOR REPAIRING THE SAME

(71) Applicant: V TECHNOLOGY CO., LTD., Yokohama (JP)

(72) Inventors: Shuji Kudo, Yokohama (JP); Ryo Noguchi, Yokohama (JP); Yuji Saito, Yokohama (JP); Zhihua Han, Yokohama (JP)

(73) Assignee: V TECHNOLOGY CO., LTD., Yokohama (JP)

( * ) Notice: Subject to any disclaimer, the term of this patent is extended or adjusted under 35 U.S.C. 154(b) by 172 days.

(21) Appl. No.: 16/081,828

(22) Filed: Aug. 31, 2018

(65) Prior Publication Data
US 2020/0199732 A1    Jun. 25, 2020

Related U.S. Application Data

(63) Continuation of application No. PCT/JP2017/011844, filed on Mar. 23, 2017.

(30) Foreign Application Priority Data

Mar. 29, 2016  (JP) .................................. 2016-066678
Dec. 13, 2016  (JP) .................................. 2016-241333

(51) Int. Cl.
  *C23C 14/04*    (2006.01)
  *B05B 12/20*    (2018.01)
  (Continued)

(52) U.S. Cl.
  CPC ............ *C23C 14/042* (2013.01); *B05B 12/20* (2018.02); *B23K 11/11* (2013.01); *B23K 26/38* (2013.01)

(58) Field of Classification Search
  USPC .......................... 118/721, 504, 505; 427/556
  See application file for complete search history.

(56) References Cited

U.S. PATENT DOCUMENTS

2015/0017759 A1    1/2015  Hirobe et al.
2015/0101536 A1*   4/2015  Han ...................... C23C 14/042
                                                          118/721
(Continued)

FOREIGN PATENT DOCUMENTS

JP    2004-335382 A    11/2004
JP    2009-041054 A     2/2009
(Continued)

OTHER PUBLICATIONS

International Preliminary Report on Patentability from Application No. PCT/JP2017/011844, dated Oct. 11, 2018, 14 pages, including English langiage translation.

(Continued)

*Primary Examiner* — Yewebdar T Tadesse
(74) *Attorney, Agent, or Firm* — Morgan, Lewis & Bockius LLP

(57) ABSTRACT

A deposition mask includes: a mask sheet formed by stacking a metal layer provided with a plurality of through holes on a film layer provided with a plurality of opening patterns, each through hole enclosing at least one of the opening patterns, and by dividing one surface of the mask sheet into a plurality of unit cells each including two or more of the opening patterns and two or more of the through holes; and a support member which is made of metal and has openings corresponding to the unit cells of the mask sheet, the support member supporting the mask sheet by being joined to the metal layer of the mask sheet to which no external tension (Continued)

is applied. This ensures high shape and positional deposition accuracy in forming thin film patterns using the deposition mask.

15 Claims, 14 Drawing Sheets

(51) Int. Cl.
*B23K 11/11* (2006.01)
*B23K 26/38* (2014.01)

(56) References Cited

U.S. PATENT DOCUMENTS

| | | |
|---|---|---|
| 2015/0283651 A1 | 10/2015 | Kudo et al. |
| 2016/0115580 A1 | 4/2016 | Mizumura |
| 2019/0100834 A1 * | 4/2019 | Sakio .................. C23C 14/24 |

FOREIGN PATENT DOCUMENTS

| | | | |
|---|---|---|---|
| JP | 2013-165060 A | 8/2013 | |
| JP | 2014-121720 A | 7/2014 | |
| JP | 2014-133938 A | 7/2014 | |
| JP | 2015-010270 A | 1/2015 | |
| TW | 201520349 | 6/2015 | |
| TW | 201805451 | 2/2018 | |
| WO | WO-2017163443 A1 * | 9/2017 | ........... C23C 14/042 |

OTHER PUBLICATIONS

Taiwanese Office Action from Taiwanese Patent Application No. 106110080, dated Sep. 7, 2018, 6 pages, including partial English language translation.

* cited by examiner

DEPOSITION MASK, METHOD FOR MANUFACTURING THE SAME, AND METHOD FOR REPAIRING THE SAME

This application is a continuation application of PCT/JP2017/011844, filed on Mar. 23, 2017.

BACKGROUND OF THE INVENTION

Field of the Invention

The present invention relates to a deposition mask having a stacked layer structure including a film layer and a metal layer, and in particular, relates to a deposition mask that ensures high shape and positional deposition accuracy in forming thin film patterns, a method for manufacturing the same, and a method for repairing the same.

Description of Related Art

A conventional deposition mask is formed by stretching and placing, on a frame having an opening, a plurality of metal thin films each having a plurality of opening patterns for letting a vapor deposition material pass through such that the metal thin films cover the opening of the frame, and by welding the metal thin films to the frame (see JP 2009-41054 A, for example).

In such a conventional deposition mask, the metal thin films each having the opening patterns are fixed to the frame with a predetermined tension applied to the metal thin films to ensure that they will not gather or sag. Consequently, the opening patterns may be undesirably deformed or displaced by application of the tension. Thus, with the conventional deposition mask, it is difficult to ensure high shape and positional deposition accuracy.

Furthermore, in the conventional deposition mask, the opening patterns are formed by etching the metal thin films, and, due to isotropy of etching, it is difficult to form the opening patterns with high shape accuracy. Thus, with the conventional deposition mask, it is difficult to form high-definition thin film patterns.

SUMMARY OF THE INVENTION

In order to address at least some of these problems, an object of the invention is to provide a deposition mask that ensures high shape and positional deposition accuracy in forming thin film patterns, a method for manufacturing the same, and a method for repairing the same.

To achieve the above object, a deposition mask according to a first aspect of the invention comprises: a mask sheet formed by stacking a metal layer provided with a plurality of through holes on a film layer provided with a plurality of opening patterns, each through hole enclosing at least one of the opening patterns, and by dividing one surface of the mask sheet into a plurality of unit cells each including two or more of the opening patterns and two or more of the through holes; and a support member which is made of metal and has openings corresponding to the unit cells of the mask sheet, the support member supporting the mask sheet by being joined to the metal layer of the mask sheet to which no external tension is applied, wherein the metal layer is formed by plating on the film layer held in close contact by a substrate under such a condition as to generate internal tensile stress to the substrate, and the support member is joined to the metal layer in which the internal tensile stress remains.

According to a second aspect of the invention, provided is a method for manufacturing the deposition mask comprising the steps of: forming a mask sheet by sequentially stacking, on a transparent substrate, a film layer and a metal layer provided with a plurality of through holes, and by dividing one surface of the mask sheet into a plurality of unit cells each including two or more of the through holes, the metal layer being formed by plating on the film layer held in close contact by a substrate under such a condition as to generate internal tensile stress to the substrate; joining a support member to the metal layer of the mask sheet to which no external tension is applied, the support member being made of metal and having openings corresponding to the unit cells; forming at least one opening pattern in a portion of the film layer corresponding to each of the through holes by irradiating with a laser beam; and stripping the transparent substrate from the mask sheet.

According to a third aspect of the invention, provided is a method for repairing the deposition mask which includes a mask sheet formed by stacking a metal layer provided with a plurality of through holes on a film layer provided with a plurality of opening patterns, each through hole enclosing at least one of the opening patterns, and by dividing one surface of the mask sheet into a plurality of unit cells each including two or more of the opening patterns and two or more of the through holes; and a support member which is made of metal and has openings corresponding to the unit cells of the mask sheet, the support member supporting the mask sheet by being joined to the metal layer of the mask sheet to which no external tension is applied. The metal layer is provided with a perforation for separating adjacent ones of the unit cells from each other along peripheries of the unit cells. The method comprises the steps of: removing a defective unit cell by cutting out a corresponding portion of the metal layer and the film layer along the perforation on a periphery of the defective unit cell; fitting a unit mask member having a same shape as each of the unit cells into a space from which the defective unit cell has been removed, the unit mask member being formed by sequentially stacking a film layer and a metal layer having a plurality of through holes; and forming an opening pattern within each of the through holes by irradiating the unit mask member with a laser beam from a surface of the metal layer.

According to the present invention, the support member supports the mask sheet which is formed by stacking the metal layer provided with the plurality of through holes on the film layer provided with the plurality of opening patterns, each through hole enclosing at least one of the opening patterns, and to which no external tension is applied. Thus, in contrast to conventional techniques, no tensile stress acts on the mask sheet. This allows each opening pattern to maintain its highly accurate shape and position, and consequently ensures high shape and positional deposition accuracy in forming thin film patterns using the deposition mask.

BRIEF DESCRIPTION OF THE DRAWINGS

FIG. 1A is a plan view; FIG. 1B is a cross-sectional view taken along line A-A as viewed from the direction indicated by arrows of FIG. 1A; and FIG. 1C is a bottom view.

FIG. 5A is a plan view of the support member; and FIG. 5B is a cross-sectional view for illustrating the step of joining the support member to a frame.

FIG. 14A is a plan view; and FIG. 14B is a cross-sectional view taken along line B-B as viewed from the direction indicated by arrows of FIG. 14A.

DESCRIPTION OF PREFERRED EMBODIMENTS

Figure 1A:
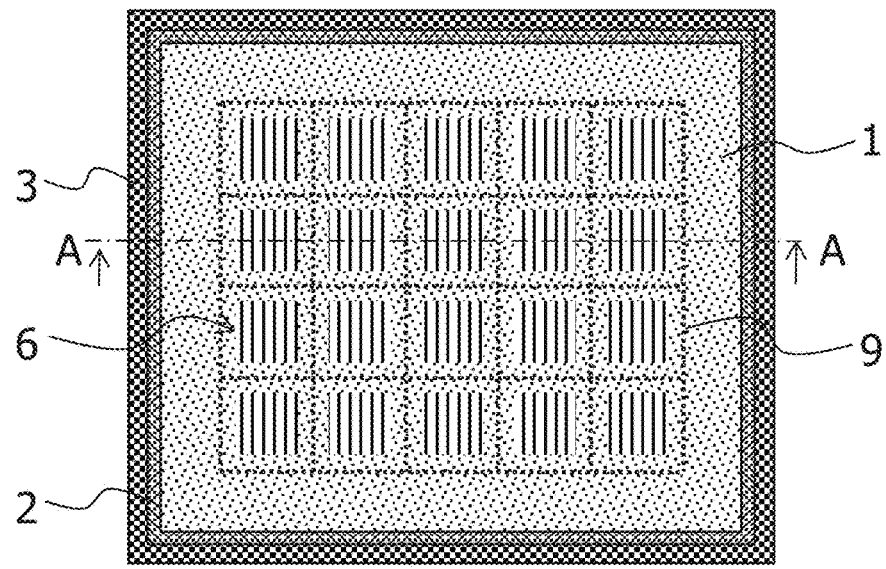
FIGS. 1A to 1C are configuration diagrams showing an embodiment of a deposition mask according to the present invention.
Figure 1B:
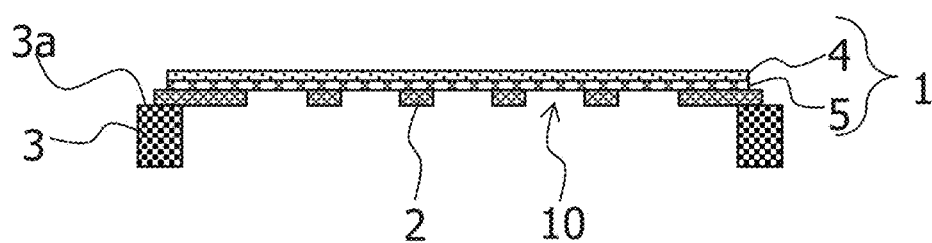
Figure 1C:
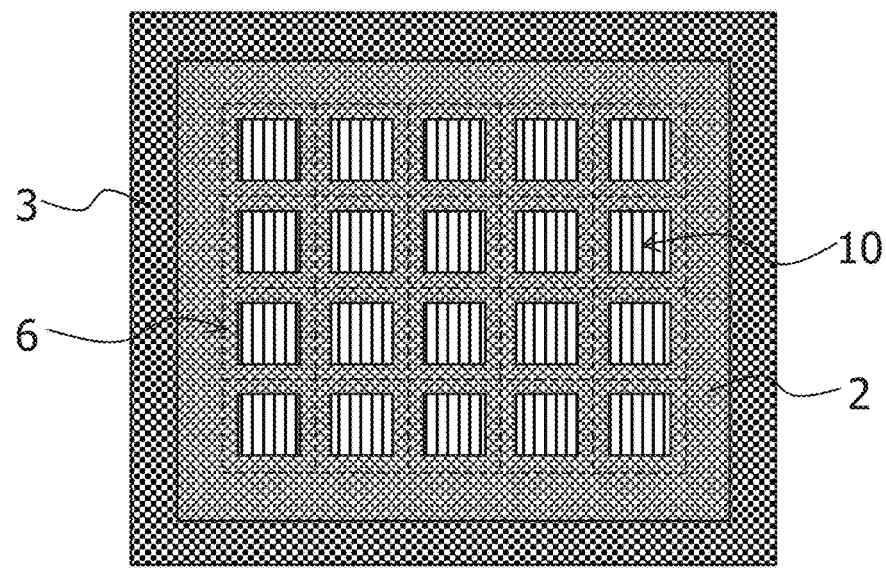

Below, an embodiment of the present invention will be described in detail with reference to the accompanying drawings. FIGS. 1A to 1C are configuration diagrams showing an embodiment of a deposition mask according to the present invention. FIG. 1A is a plan view. FIG. 1B is a cross-sectional view taken along line A-A as viewed from the direction indicated by arrows of FIG. 1A. FIG. 1C is a bottom view. The deposition mask is used in depositing a deposition material onto a substrate by vapor deposition or sputtering to form thin film patterns on the substrate. The deposition mask includes a mask sheet 1, a support member 2, and a frame 3.

The mask sheet 1 constitutes a main body of the deposition mask. The mask sheet 1 has a stacked layer structure including a film layer 4 provided with a plurality of opening patterns and a metal layer 5 provided with a plurality of through holes each enclosing at least one of the opening patterns. One surface of the mask sheet 1 is divided into a plurality of unit cells 6 each including two or more of the opening patterns and two or more of the through holes.

Specifically, the film layer 4 is a film made of a resin such as polyimide or polyethylene terephthalate (PET). As shown in an enlarged sectional view of each unit cell 6 of FIG. 2, a plurality of opening patterns 7 each having the same shape and dimension as the corresponding thin film pattern are formed in the film layer 4 at positions corresponding to the thin film patterns to be formed in the deposition target substrate. More specifically, each opening pattern 7 may be an elongated slit-like pattern or a fine rectangular pattern.

The opening patterns 7 may be formed in the film layer 4 by an appropriate method for a given need, such as by performing laser ablation on the film layer 4 while it is in close contact to a glass substrate or by performing laser ablation on the film layer 4 after it has been stripped off from the glass substrate. Also, the irradiation positions of a laser beam for forming the opening patterns 7 may be calculated by an appropriate method for a given need. For example, such irradiation positions may be calculated based on an alignment mark previously formed in the metal layer 5 (described later) for alignment with the deposition target substrate or based on an alignment mark provided on the stage of the laser processing apparatus. Forming the opening patterns 7 in the film layer 4 while it is in close contact to the glass substrate can reduce or prevent burrs from being formed at the edges of the opening patterns 7. In the following description, the opening patterns 7 are formed in the film layer 4 while it is in close contact to the glass substrate.

The metal layer 5 is joined onto one surface of the film layer 4. The metal layer 5 is attracted by the magnetic force of a magnet disposed on the back surface of the deposition target substrate so as to bring the film layer 4 into close contact to the surface of the deposition target substrate. The metal layer 5 is made of a magnetic metal material such as nickel, a nickel alloy, or Invar (Registered Trademark). As the materials for the metal layer 5 and the film layer 4, it is preferable to select materials having substantially the same thermal expansion coefficient.

Figure 2:
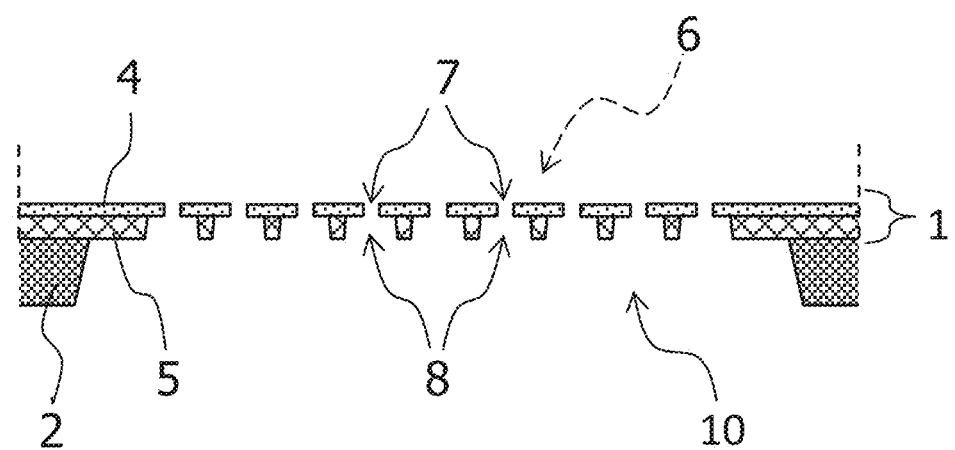
FIG. 2 is an enlarged cross-sectional view of a substantial portion of the deposition mask according to the present invention.

More specifically, as shown in FIG. 2, the metal layer 5 is provided with a plurality of through holes 8 each enclosing at least one of the opening patterns 7. Furthermore, as shown in FIG. 1A, the metal layer 5 is also provided with perforations 9 for separating adjacent unit cells 6 from each other along the peripheries of the unit cells 6 so that each unit cell 6 of the metal layer 5 can be cut out.

If the deposition mask is used for a multiple display substrate, i.e., used, for example, in forming a plurality of display panels so as to be imposed together on a large deposition target substrate, each unit cell 6 of the mask sheet 1 corresponds to one display panel.

The support member 2, which is made of a metal, is joined onto the metal layer 5 of the mask sheet 1. This support member 2 supports the mask sheet 1 by being joined to the metal layer 5 of the mask sheet 1 in a non-tensioned state, i.e., the mask sheet 1 to which no external tension is applied. As shown in FIG. 2, the support member 2 has openings 10 corresponding to the unit cells 6 of the mask sheet 1 so that each opening encloses the opening patterns 7 and the through holes 8 within the corresponding unit cell 6. The support member 2 is a sheet-shaped member having a thickness of 100 μm to 300 μm, and is made of a metal material having a smaller thermal expansion coefficient than that of the material used in the metal layer 5. For example, when the metal layer 5 is formed of nickel, the support member 2 is made of Invar.

The metal layer 5 of the mask sheet 1 and the support member 2 are joined together preferably by laser spot welding at least at the periphery of each opening 10. When laser spot welding is employed, the metal layer 5 is irradiated with a laser beam through a transparent substrate 11 (described later), which is in close contact to the film layer 4 of the mask sheet 1 and supports the mask sheet 1 during the manufacturing process of the deposition mask. Instead of laser spot welding, however, the support member 2 and the metal layer 5 may be joined together with an adhesive.

The frame 3 is joined to a peripheral portion of the support member 2. The frame 3, which is made of Invar, supports the support member 2 with a predetermined tension applied thereto to ensure that the support member 2 will not gather or sag. Specifically, the frame 3 and the support member 2 are joined together by spot welding a peripheral region of the support member 2 to one end surface 3a of the frame 3.

Figure 3A:
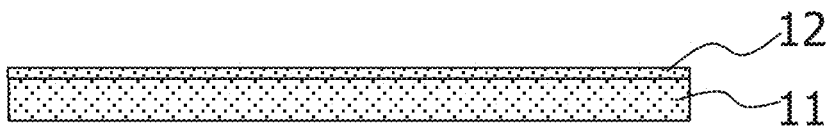
FIGS. 3A to 3H are cross-sectional views for illustrating the first half of the process of forming a mask sheet in the method for manufacturing the deposition mask according to the present invention.

Next, a method for manufacturing the deposition mask having the above structure will be described. First, the process of forming the mask sheet 1 will be described with reference to FIGS. 3A to 3H and FIG. 4. In the process of forming the mask sheet 1, a polyimide film 12 is first formed on the transparent substrate 11 as shown in FIG. 3A. Specifically, a resin liquid such as a polyimide liquid is applied on the transparent substrate 11, which is made of a transparent glass or the like, and the applied polyimide liquid is heated and cured at 200° C. to 450° C., and formed into the polyimide film 12 having a thickness of about 5 μm to 30 μm.

Figure 3B:
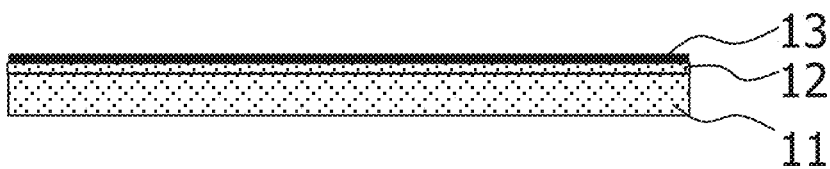

Next, as shown in FIG. 3B, a seed layer 13 made of, for example, nickel or a nickel alloy and having a thickness of about 50 to 150 nm, for example, is formed on the polyimide film 12 by sputtering, vapor deposition, or electroless plating.

Figure 3C:
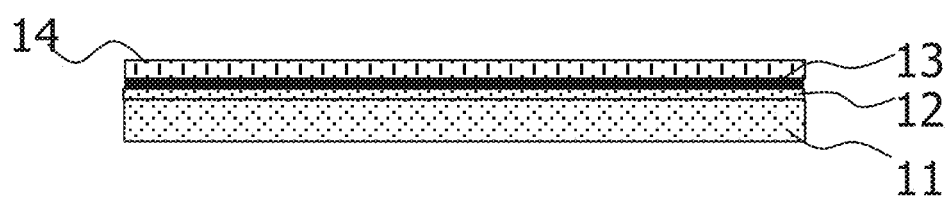

Then, a resist layer 14 is formed as shown in FIG. 3C. Specifically, a liquid photoresist is applied on the seed layer 13 to the same thickness as the metal layer 5 to be formed, for example, to a thickness of about 10 μm to 30 μm, and then dried and formed into the resist layer 14.

Figure 3D:
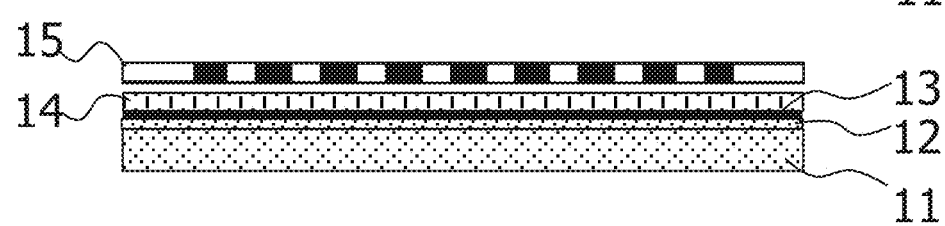

Subsequently, as shown in FIG. 3D, a known exposure apparatus is used to expose the resist layer 14 through a photomask 15 that is carefully positioned and placed on the resist layer 14.

Figure 3E:
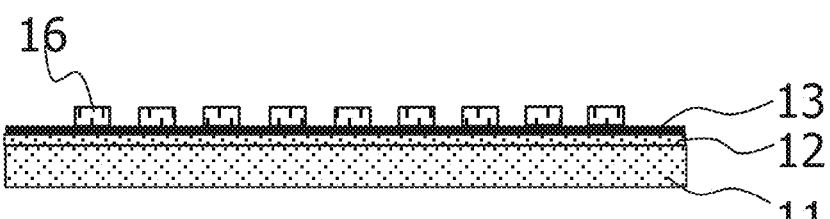

Then, as shown in FIG. 3E, a resist mask having a plurality of island patterns 16 at positions corresponding to the plurality of through holes 8 to be formed is developed using a developer for the photoresist. Here, a positive resist is used as the photoresist and exposed portions of the photoresist are dissolved in the developer, but a negative resist may be used instead. Still alternatively, a dry film resist may be used instead of the liquid resist.

Figure 3F:
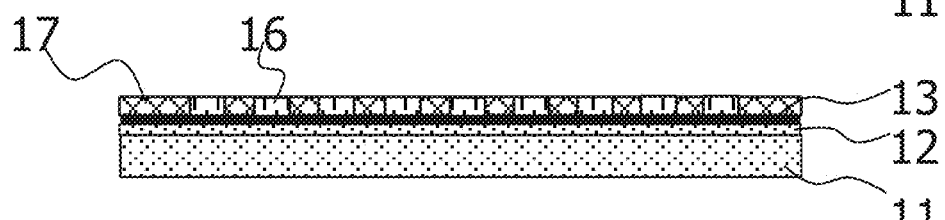

Next, as shown in FIG. 3F, a nickel layer 17 is formed by immersing and electroplating the transparent substrate 11 in a nickel plating bath such that nickel is deposited on the seed layer 13 at regions outside the island patterns 16 to substantially the same thickness as the resist layer 14, i.e., to a thickness of 5 μm to 20 μm.

Figure 3G:
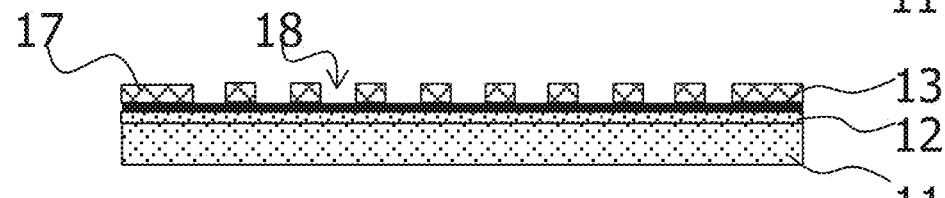

Then, as shown in FIG. 3G, the resist layer 14 is removed by washing the transparent substrate 11 with an organic solvent or a liquid stripper for the photoresist. As a result, the nickel layer 17 having recesses 18 each extending to the seed layer 13 at positions corresponding to the island patterns 16 is formed.

Figure 3H:
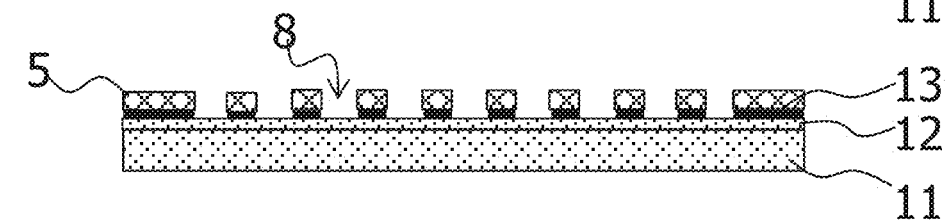

After that, as shown in FIG. 3H, the seed layer 13 exposed in the recesses 18 of the nickel layer 17 is etched off using a known etching solution. As a result, the metal layer 5 having the through holes 8 extending to the polyimide film 12 is formed.

Figure 4:
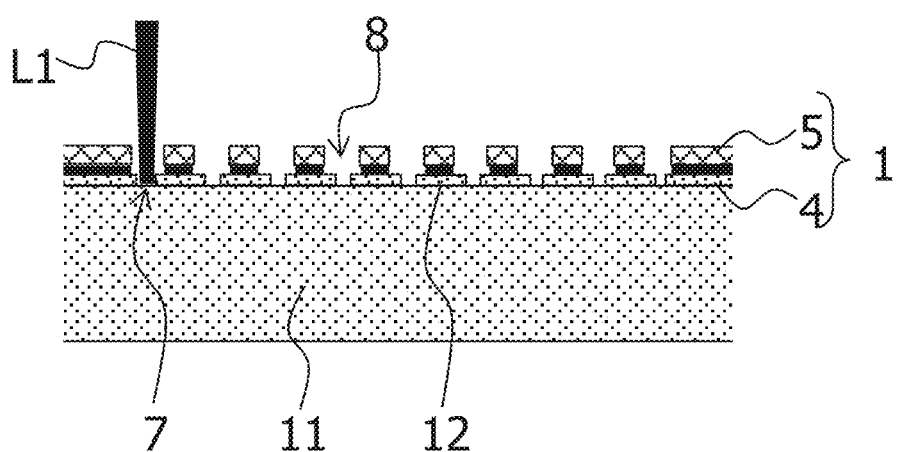
FIG. 4 is an enlarged cross-sectional view of a substantial portion for illustrating the last half of the process of forming the mask sheet in the method for manufacturing the deposition mask according to the present invention.

Then, as shown in FIG. 4, the opening patterns 7 are formed so as to correspond to the to-be-formed thin film patterns by irradiating and ablating the polyimide film 12 in the through holes 8 of the metal layer 5 with a laser beam L1 having a wavelength of 400 nm or less using a laser source such as a KrF excimer laser operating at 248 nm or a YAG laser operating at 355 nm. As a result, the mask sheet 1 is formed as a stack of the film layer 4 having the opening patterns 7 and the metal layer 5 having the through holes 8 each enclosing at least one of the opening patterns 7.

Note that the metal layer 5 having the through holes 8 each extending to the polyimide film 12 does not have to be formed by electroplating. Alternatively, the metal layer 5 having the through holes 8 may be formed by first forming the nickel layer 17 on the polyimide film 12 by vapor deposition or sputtering and then etching the nickel layer 17 through a resist mask having openings corresponding to the through holes 8.

In the metal layer 5, the perforations 9 for separating adjacent unit cells 6 from each other along the peripheries of the unit cells 6 are formed through the same process as in forming the through holes 8 at the same time.

Figure 5A:
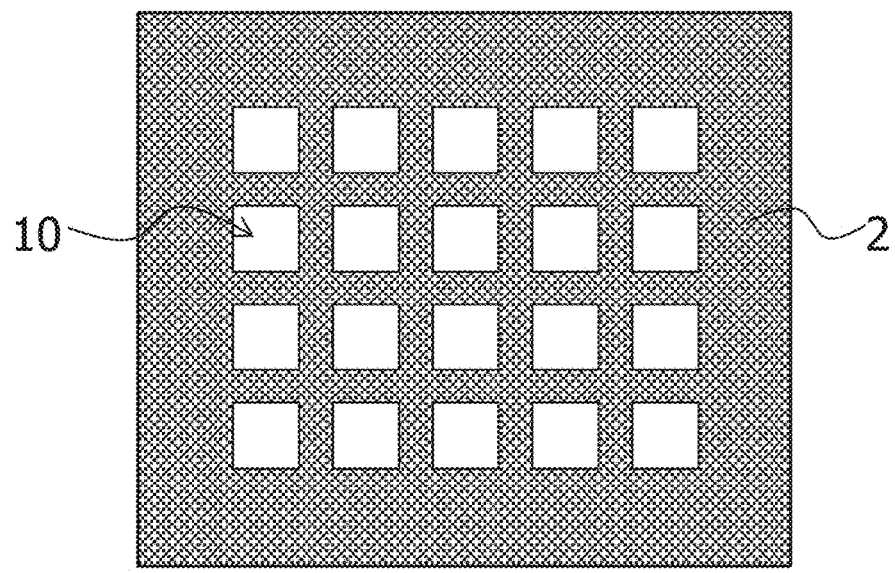
FIGS. 5A and 5B illustrate the process of forming a support member in the method for manufacturing the deposition mask according to the present invention.

Next, the process of forming the support member 2 will be described with reference to FIGS. 5A and 5B. In the process of forming the support member 2, the openings 10 are first formed as shown in the plan view of FIG. 5A. Specifically, a metal sheet made of, for example, Invar having a larger area size than the mask sheet 1 and a thickness of about 100 μm to about 2000 μm is prepared, and the openings 10 are formed in the metal sheet by, for example, etching, punching or laser processing such that the openings 10 correspond to the unit cells 6 of the mask sheet 1 and each opening 10 has a size large enough to enclose the opening patterns 7 and through holes 8 within the corresponding unit cell 6.

Figure 5B:
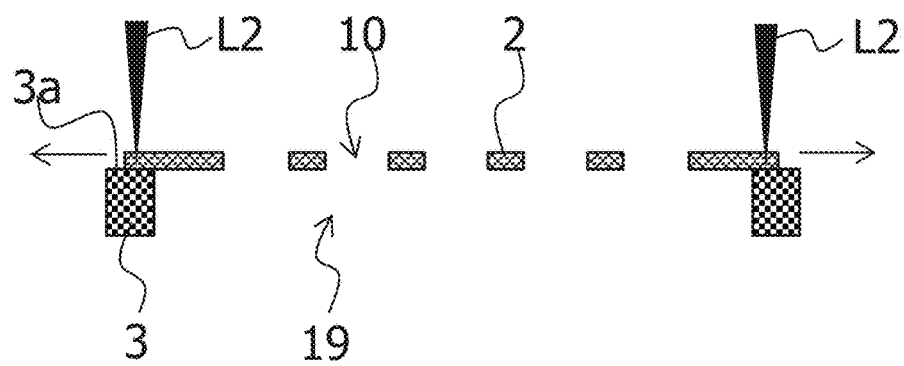

Then, as shown in the cross-sectional view of FIG. 5B, the support member 2 is joined to the frame 3. Specifically, the support member 2 is placed so as to cover an opening 19 of the frame 3 and stretched with tension applied in the directions as indicated by arrows to ensure that the support member 2 will not undergo deflection. Then, the support member 2 in the above state is spot welded to the one end surface 3a of the frame 3 by irradiating the peripheral region of the support member 2 with a laser beam L2. In this way, the support member 2 fixedly supported by the frame 3 is completed.

Figure 6A:
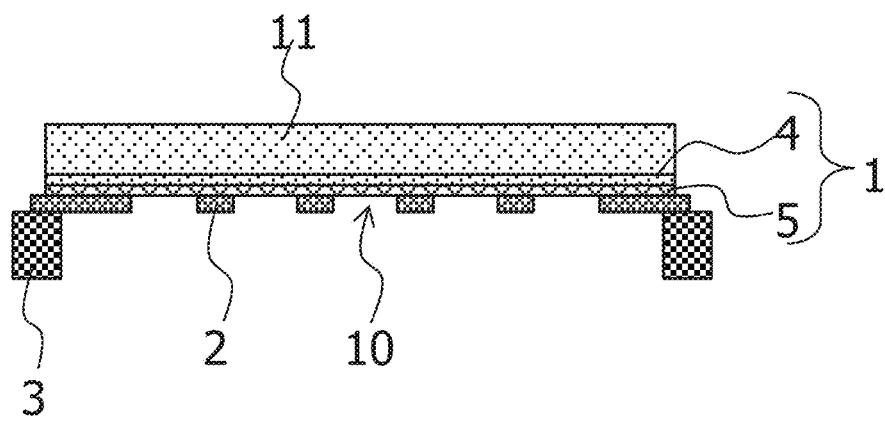
FIGS. 6A and 6B illustrate the process of joining the mask sheet and the support member together in the method for manufacturing the deposition mask according to the present invention.

Subsequently, the process of joining the mask sheet 1 and the support member 2 together will be described with reference to FIGS. 6A and 6B. In this joining process, the step as shown in FIG. 6A is performed first. Specifically, the mask sheet 1 is carefully positioned on the support member 2 with the metal layer 5 facing the support member 2 such that the unit cells 6 of the mask sheet 1 are exactly positioned on the openings 10 of the support member 2. Then, the mask sheet 1 in the above state is brought into close contact to the support member 2.

Figure 6B:
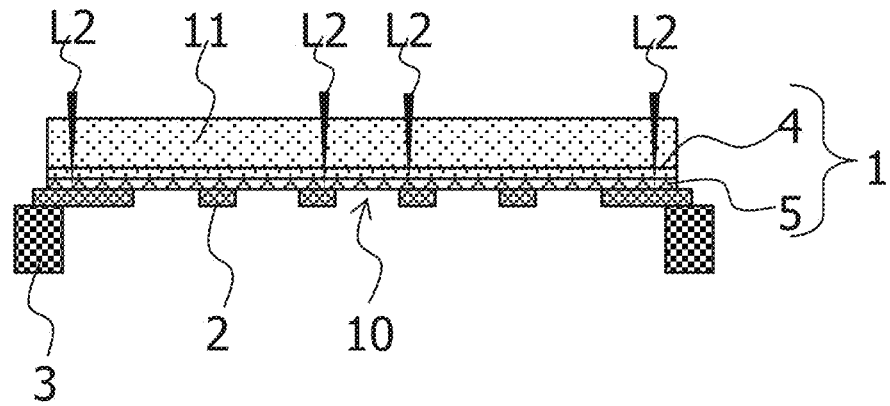
Figure 7:
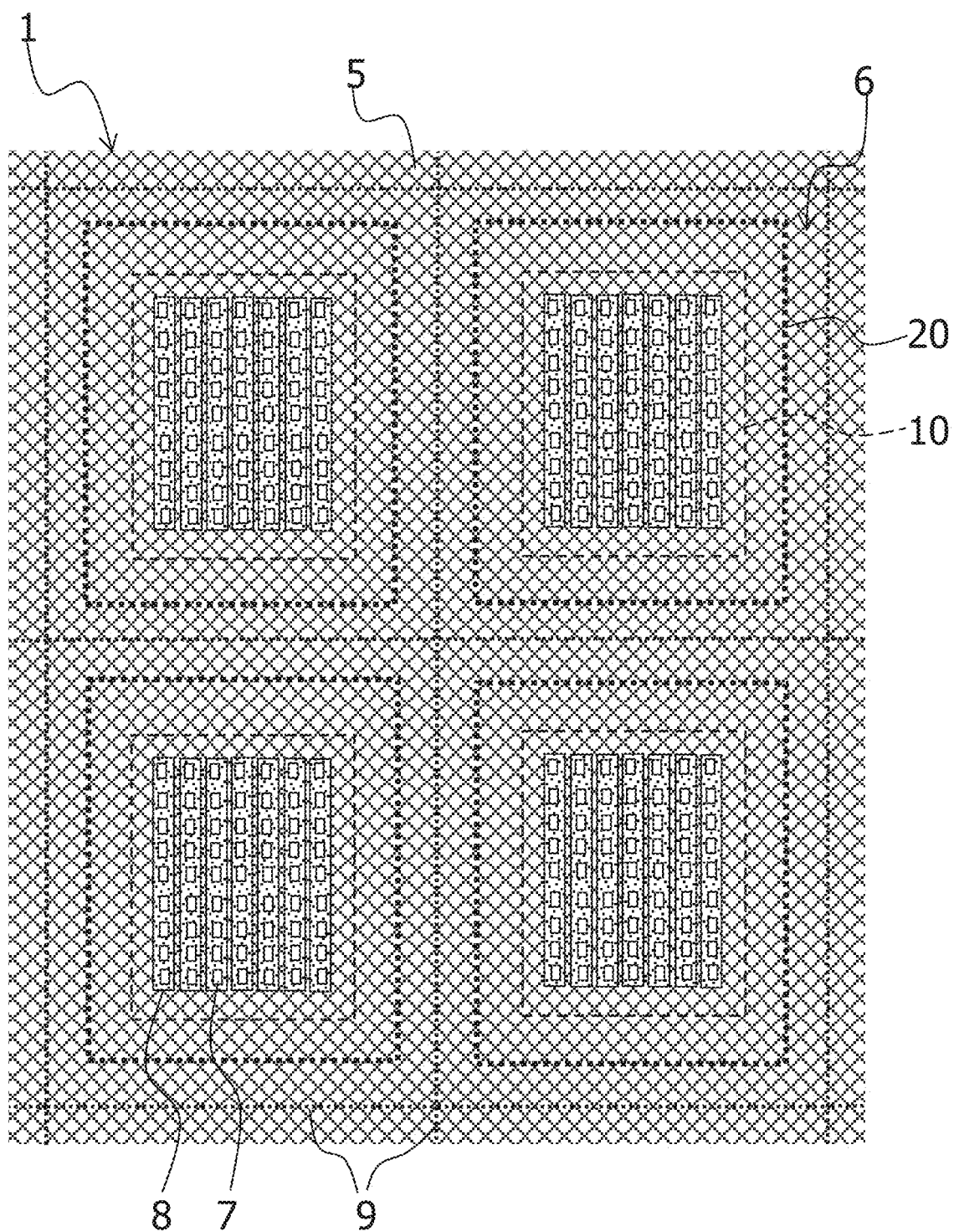
FIG. 7 is a diagram that specifically illustrates the state of FIG. 6B.

Next, as shown in FIG. 6B, the metal layer 5 of the mask sheet 1 and the support member 2 are spot welded together by irradiating the metal layer 5 with the laser beam L2 through the transparent substrate 11 at positions corresponding to the peripheries of the openings 10 of the support member 2 and to a peripheral region of the mask sheet 1. Specifically, as shown in FIG. 7, welded spots 20 are established in regions each extending between the periphery of one of the openings 10 and the periphery of the corresponding unit cell 6 of the mask sheet 1 by irradiating the regions with the laser beam L2.

Subsequently, the process of stripping the transparent substrate 11 will be described with reference to FIG. 8. In the process of stripping the transparent substrate 11, the film layer 4 of the mask sheet 1 is irradiated with a line-shaped laser beam L3, for example, having an energy density of 250 mJ/cm$^2$ with a wavelength of 308 nm through the transparent substrate 11 while the laser beam L3 is moved from one end to the other end of the mask sheet 1. Thereby, the transparent substrate 11 is stripped off from the mask sheet 1, and the deposition mask according to the present invention as shown in FIGS. 1A to 1C is completed.

With the method for manufacturing the deposition mask according to the present invention, the mask sheet 1 is kept supported on the transparent substrate 11 during the manufacture of the deposition mask, and the transparent substrate 11 is not stripped off from the mask sheet 1 until the final step of the manufacturing process. Thus, no external tensile stress acts on the mask sheet 1 throughout the manufacturing process. This allows each opening pattern 7, which is laser processed in the mask sheet 1, to maintain its highly accurate shape and position, and consequently ensures high shape and positional deposition accuracy in forming thin film patterns using the deposition mask.

Figure 9A:
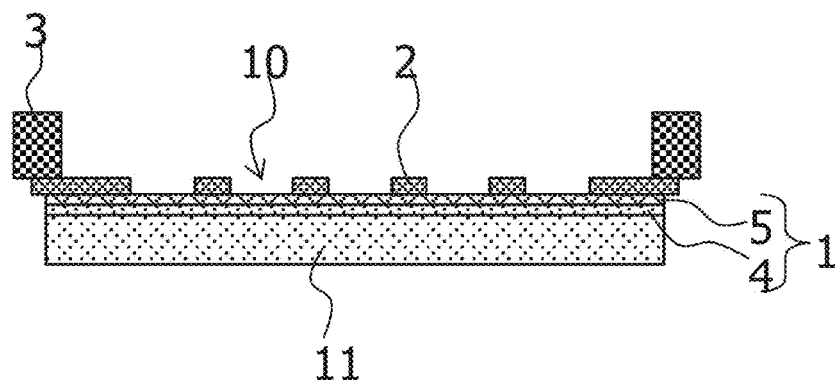
FIGS. 9A and 9B illustrate a modification in which the opening patterns are formed in an alternative way in the method for manufacturing the deposition mask according to the present invention.
Figure 9B:
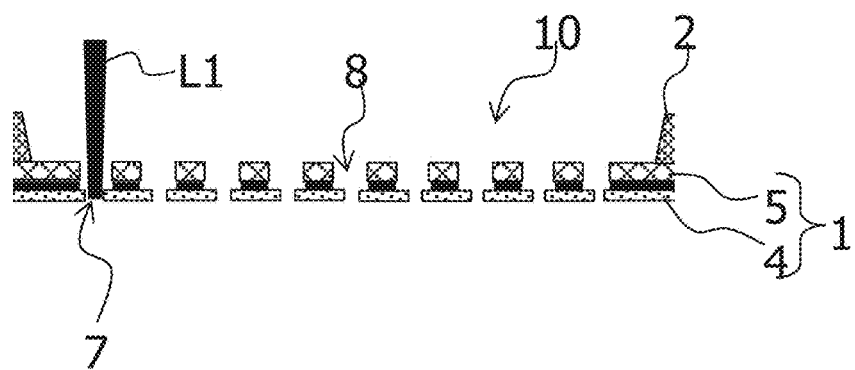

In the above embodiment, the opening patterns 7 are formed in the final stage of the process of forming the mask sheet 1 as shown in FIG. 4. However, the opening patterns 7 may be formed after the mask sheet 1 and the support member 2 are joined together as shown in FIG. 9A and the transparent substrate 11 are then stripped off. Here, as shown in FIG. 9B, the opening patterns 7 may be formed through irradiation of the laser beam L1 from the surface of the support member 2. In this case as well, no external tensile stress acts on the mask sheet 1, and thus each opening pattern 7, which is laser processed in the mask sheet 1, can maintain its highly accurate shape and position.

Figure 10A:
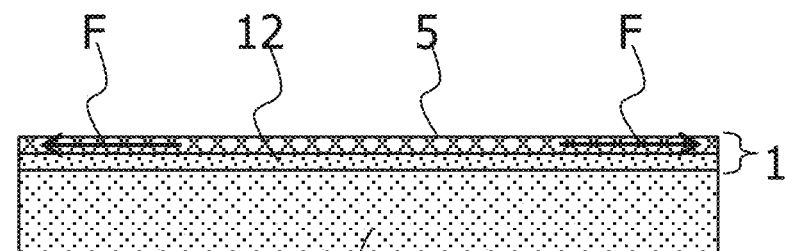
FIGS. 10A to 10C illustrate a modification of the method for manufacturing the deposition mask according to the present invention.
Figure 10B:
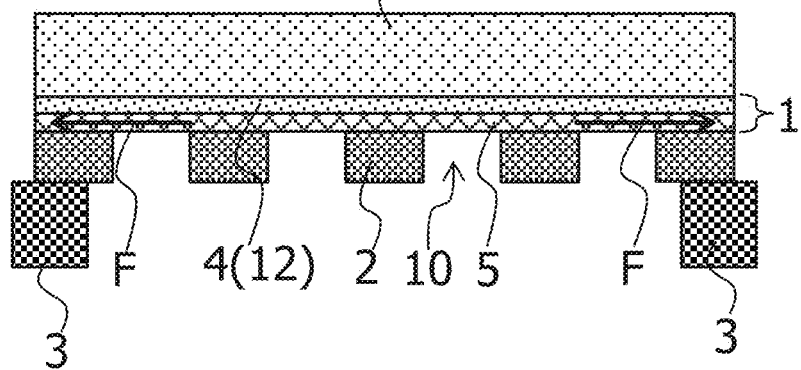
Figure 10C:
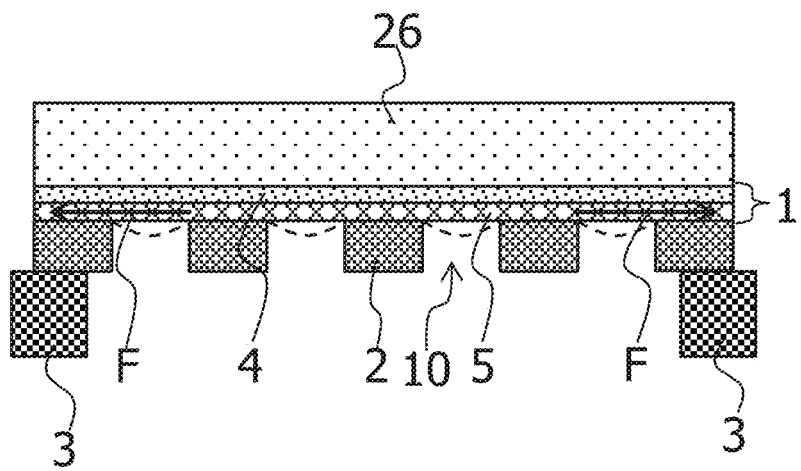

FIGS. 10A to 10C illustrate a modification of the method for manufacturing the deposition mask according to the present invention. In this method for manufacturing the deposition mask, internal stress (tensile stress) to the transparent substrate 11 is intentionally generated in the metal layer 5 during the process of forming the nickel layer 17 by plating in FIG. 3F. The internal stress (tensile stress) is intended to be utilized to prevent or reduce deflection of the deposition mask which may occur when the deposition mask is mounted to the mask holder of the vapor deposition apparatus.

It is generally well known that, when a metal thin film is formed on a base member by plating, internal stress (tensile stress) to the base member may be generated in the thus-formed metal thin film depending on the plating conditions. Accordingly, in the present invention, such plating conditions are appropriately set so as to intentionally generate internal stress (tensile stress) to the transparent substrate 11 in the metal layer 5 which is formed by plating. Below, the purpose and effects of generating internal stress (tensile stress) in the metal layer 5 will be described with reference to FIGS. 10A to 10C.

When the metal layer 5 is formed by plating on the polyimide film 12 (film layer 4) held in close contact by the transparent substrate 11 under predetermined plating conditions through the steps of FIGS. 3A to 3F, internal stress (tensile stress) to the transparent substrate 11 is generated in the metal layer 5 as indicated by arrows F of FIG. 10A.

After that, through the steps of FIGS. 3G and 3H, the metal layer 5 having the through holes 8 is formed on the polyimide film 12 (film layer 4). Then, as shown in FIG. 10B, the metal support member 2 which has the openings 10 corresponding to the unit cells 6 and which has peripheral portions already fixed to the frame 3 is joined to the metal layer 5 of the mask sheet 1 to which no external tension is applied. At that time, the internal stress (tensile stress) remains in the metal layer 5 as indicated by arrows F in FIG. 10B.

Subsequently, before or after the mask sheet 1 is stripped off from the transparent substrate 11, the polyimide film 12 (film layer 4) in the through holes 8 of the metal layer 5 is irradiated with a laser beam, and at least one opening pattern 7 is formed therein. Here, internal stress (tensile stress) still remains in the metal layer 5 even after the mask sheet 1 has been stripped off from the transparent substrate 11, since the thickness of the support member 2 joined to the metal layer 5 of the mask sheet 1 is much thicker than the thickness of the metal layer 5.

When used in practice for deposition, the thus-formed deposition mask is held by the mask holder of the deposition apparatus with the film layer 4 in close contact to the deposition surface of the deposition target substrate 26, as shown in FIG. 10C. At that time, generally, deflection due to thermal expansion occurs in the mask sheet 1 as indicated by dashed line in FIG. 10C. However, according to the present invention, internal stress (tensile stress) indicated by arrows F that remains in the metal layer 5 prevents or reduces such deflection of the mask sheet 1. As a result, the gap between the mask sheet 1 and the deposition target substrate 26 can be reduced, which ensures high shape and positional accuracy in forming thin film patterns on the deposition target substrate 26.

The amount of deflection of the mask sheet 1 and the support member 2 depends on factors such as the size of the deposition mask, the difference in thermal expansion between the mask sheet 1 and the support member 2, and the attractive force exerted on the support member 2 by the magnet disposed on the back surface of the deposition target substrate 26. Accordingly, the magnitude of the internal stress (tensile stress) intentionally imparted into the metal layer 5 is determined in consideration of this deflection amount. Specifically, by carrying out experiments while appropriately changing the plating conditions of the metal layer 5, the plating conditions to be employed are determined so that the deflection amount falls within an allowable range.

Figure 11A:
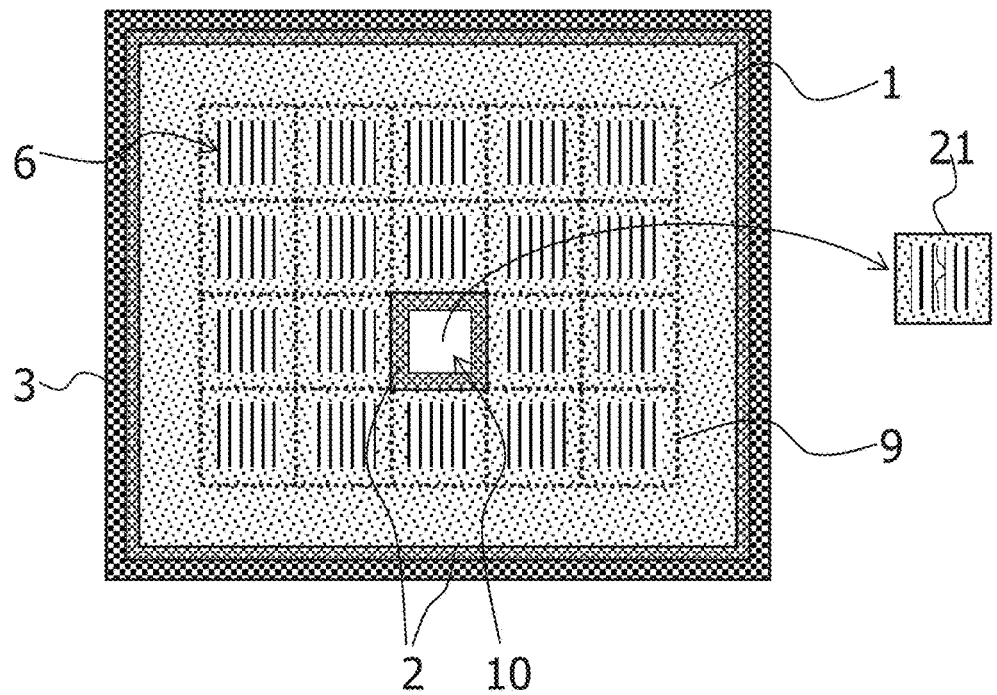
FIGS. 11A and 11B illustrate the first half process in the method for repairing the deposition mask according to the present invention.
Figure 11B:
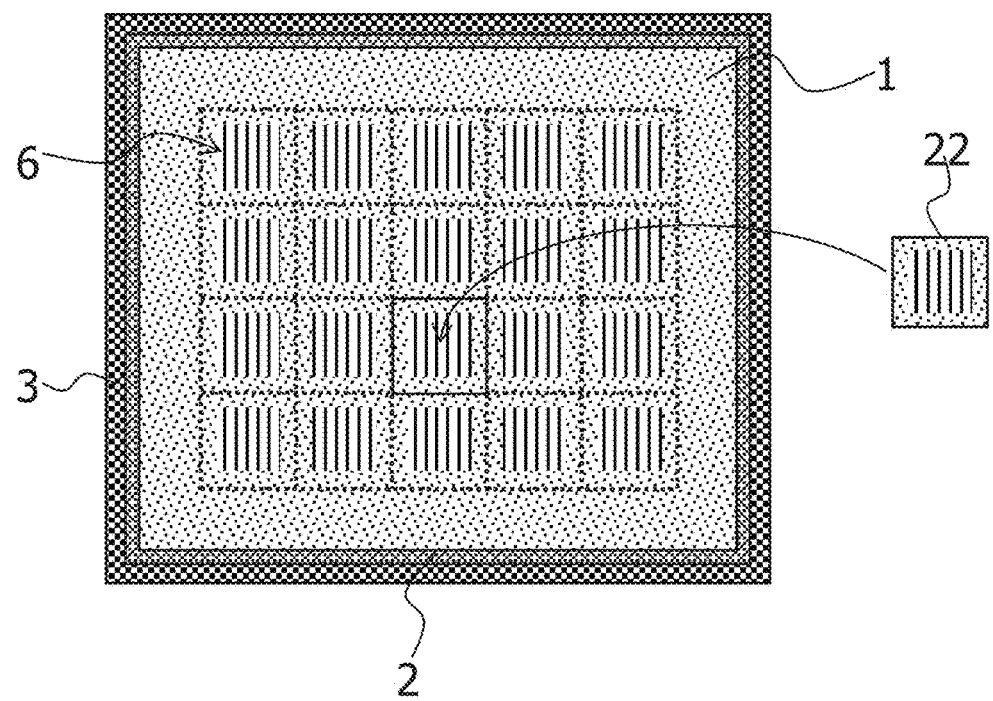

FIGS. 11A and 11B illustrate procedural steps of a method of repairing a deposition mask according to the present invention. As shown in FIG. 11A, when any of the opening patterns 7 or the through holes 8 in one of the unit cells 6 of the mask sheet 1 is defective, this unit cell 6 (referred to as "defective unit cell 21" below) is removed by cutting out the corresponding portion of the metal layer 5 and the film layer 4 along the perforations 9 on the periphery of the defective unit cell 21 by, for example, air blowing. The perforations 9 facilitate cutting out the defective unit cell 21. Instead of air blowing, the defective unit cell 21 may be cut out and removed by drawing a knife with its blade aligned along the perforations 9.

Figure 12A:
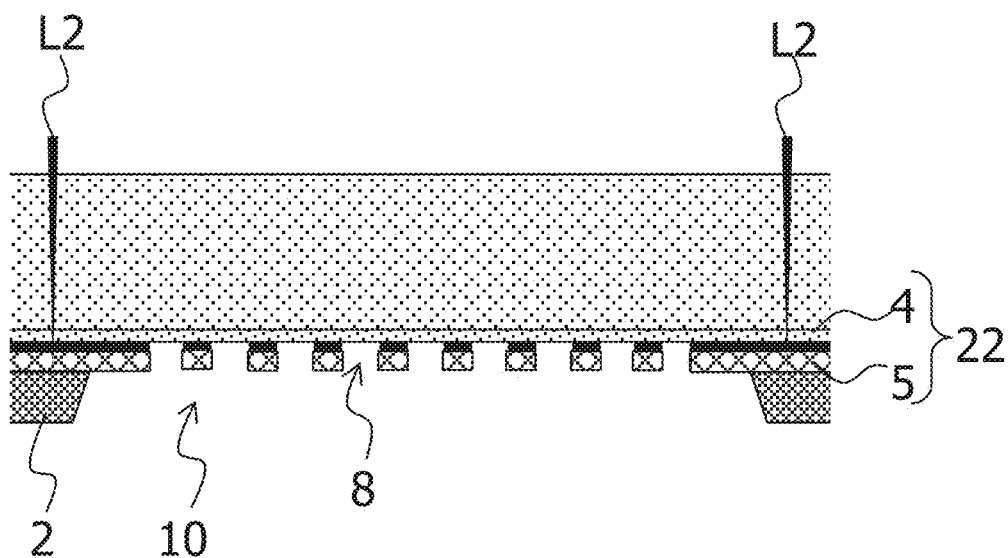
FIGS. 12A and 12B illustrate the last half process in the method for repairing the deposition mask according to the present invention.

Next, as shown in FIG. 11B, a unit mask member 22 having the same shape as each unit cell 6 is fitted into the space from which the defective unit cell 21 has been removed. Here, the unit mask member 22 is previously prepared by stacking, on the transparent substrate 11, the film layer 4 and the metal layer 5 having the through holes 8 through the same process as in FIGS. 3A to 3H. After that, as shown in FIG. 12A, the periphery of the unit mask member 22 is irradiated with the laser beam L2 through the transparent substrate 11, and the metal layer 5 of the unit mask member 22 and the support member 2 are spot welded together.

Figure 8:
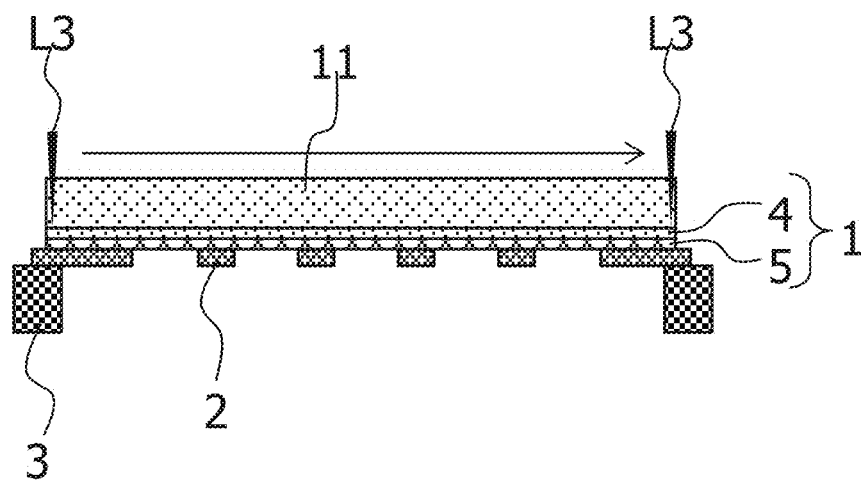
FIG. 8 illustrates the process of stripping the transparent substrate in the method for manufacturing the deposition mask according to the present invention.
Figure 12B:
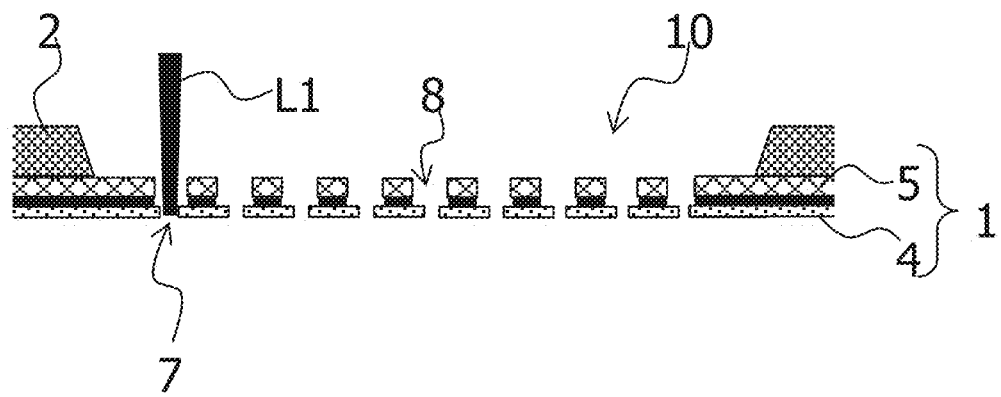

After that, in the same manner as in FIG. 8, the unit mask member 22 is irradiated with the laser beam L3 through the transparent substrate 11, and the transparent substrate is stripped off. Then, as shown in FIG. 12B, the unit mask member 22 is irradiated with the laser beam L1 from the surface of the metal layer 5, and opening patterns 7 are formed in the film layer 4 within the through holes 8 corresponding to the thin film patterns to be formed. The opening patterns 7 are formed in the film layer 4 within the through holes 8 so as to correspond to the to-be-formed thin film patterns. In this way, repair of the deposition mask is completed. Note that the opening patterns 7 may be formed in the film layer 4 before the transparent substrate 11 is stripped off.

Figure 13A:
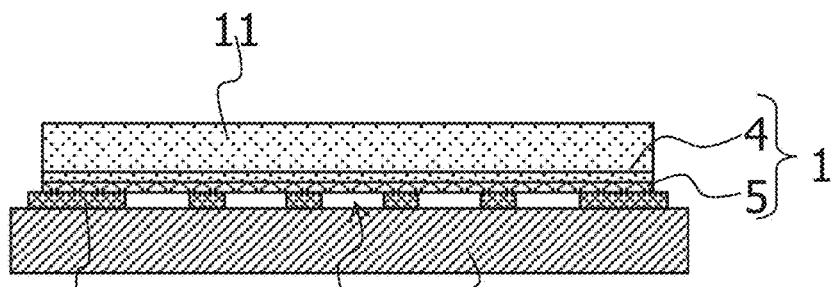
FIGS. 13A to 13D illustrate a method for manufacturing the deposition mask without a frame according to the present invention.

In the above description, the deposition mask with the frame 3 has been described. However, the present invention is not limited to this, and the frame 3 may be omitted. In this case, the deposition mask may be manufactured as follows. First, the step as shown in FIG. 13A is performed. Specifically, the mask sheet 1 is prepared by stacking, on the film layer 4 provided with the opening patterns 7, the metal layer 5 provided with the through holes 8 each enclosing at least one of the opening patterns 7, and by dividing one surface of the mask sheet 1 into the unit cells 6 each including two or more of the opening patterns and two or more of the through holes. Then, the mask sheet 1 is carefully positioned on the support member 2 which is placed and fixed on a flat surface of a table 23 with the metal layer 5 facing the support member 2 such that the unit cells 6 of the mask sheet 1 are exactly positioned on the openings 10 of the support member 2. After that, the mask sheet 1 in the above state is brought into close contact to the support member 2.

Figure 13B:
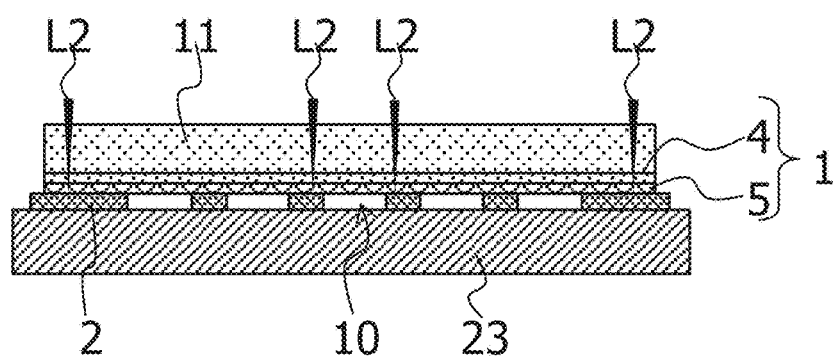

Next, as shown in FIG. 13B, the metal layer 5 of the mask sheet 1 and the support member 2 are spot welded together by irradiating the metal layer 5 with the laser beam L2 through the transparent substrate 11 at the peripheries of the openings 10 of the support member 2 and at the peripheral region of the mask sheet 1. Specifically, as shown in FIG. 7, regions each extending between the periphery of one of the openings 10 and the periphery of the corresponding unit cell 6 of the mask sheet 1 are irradiated with the laser beam L2.

Figure 13C:
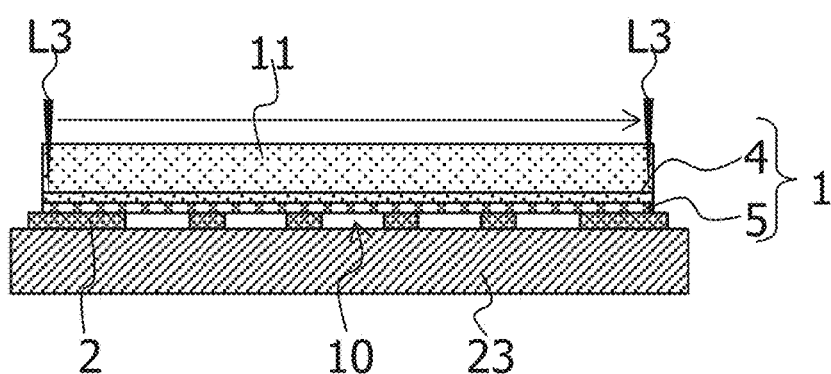

Then, as shown in FIG. 13C, the film layer 4 of the mask sheet 1 is irradiated with the line-shaped laser beam L3, for example, having an energy density of 250 mJ/cm$^2$ with a wavelength of 308 nm through the transparent substrate 11 while the laser beam L3 is moved from one end to the other end of the mask sheet 1. Thereby, the transparent substrate 11 is stripped off from the mask sheet 1.

Figure 13D:
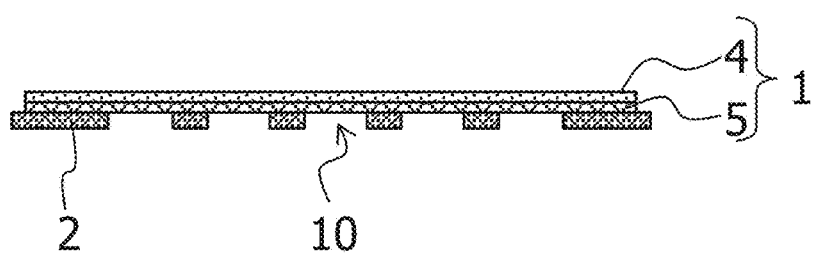

In this way, the deposition mask according to the present invention without the frame 3 as shown in FIG. 13D is completed. In this case, a magnet may be disposed on the back surface of the table 23. This allows the magnetic force of the magnet to fix the support member 2 in close contact onto the table 23 and facilitates the stripping of the transparent substrate 11. This also facilitates the removal of the deposition mask from the table 23, which can be done simply by cancelling the action of the magnetic force of the magnet.

When deposition is performed in practice using such a deposition mask without the frame 3, the deposition mask may be mounted to a mask holder having a beam in a portion which will not affect the deposition in the deposition apparatus. This can prevent or reduce deflection of the deposition mask, and ensure high positional deposition accuracy.

Figure 14A:
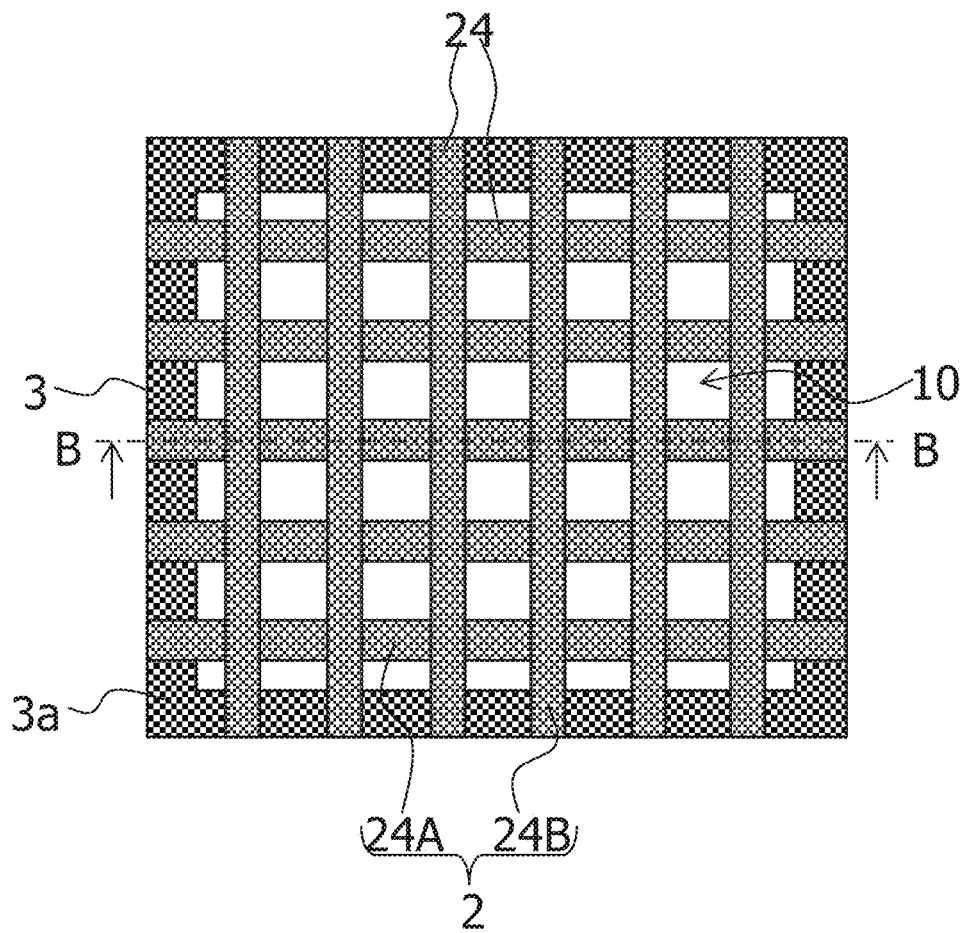
FIGS. 14A and 14B show a modification of the support member.
Figure 14B:
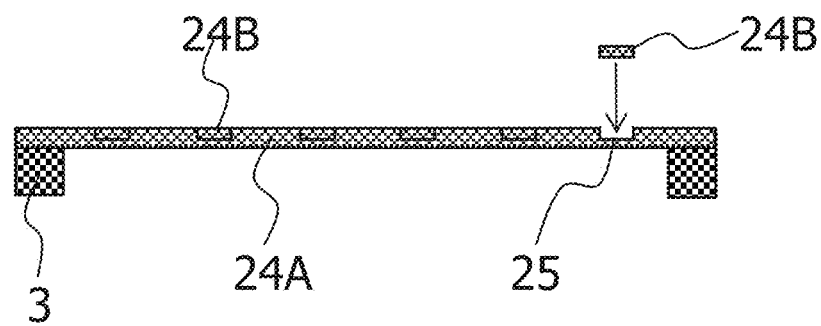

In the above description, the support member 2 is a sheet-shaped member. However, the present invention is not limited to this. Alternatively, as shown in FIGS. 14A and 14B, the support member 2 may be formed of a plurality of belt-shaped members 24 lined up in parallel in at least one direction. In this case, each portion between adjacent belt-shaped members 24 corresponds to one opening 10.

Specifically, as shown in FIG. 14A, the support member 2 may be formed of thick belt-shaped members 24A and thin belt-shaped members 24B which are crossed in a grid. In this case, as shown in FIG. 14B, grooves 25 are formed in the surface, to face the metal layer 5, (the upper surface in FIG. 14B) of each belt-shaped member 24A, and the belt-shaped members 24B are fitted into the grooves 25 as indicated by arrow in FIG. 14B so that the surface, to face the metal layer 5, of the support member 2 is flat. Note that the grooves 25 may be omitted. In this case, the mask sheet 1 is spot welded onto the belt-shaped members 24, which are located higher up in the stack, of the support member 2.

Furthermore, the ends of the belt-shaped members 24 may be put in grooves provided on the one end face 3a of the frame 3 such that the surface, to face the metal layer 5, of the support member 2 is flush with the one end face 3a of the frame 3.

It should be noted that the entire contents of Japanese Patent Application No. 2016-066678, filed on Mar. 29, 2016, and No. 2016-241333, filed on Dec. 13, 2016, based on which convention priority is claimed herein, is incorporated herein by reference.

It should also be understood that many modifications and variations of the described embodiment of the invention will be apparent to a person having an ordinary skill in the art without departing from the spirit and scope of the present invention as claimed in the appended claims.

What is claimed is:

1. A deposition mask comprising:
   a mask sheet formed by stacking a metal layer provided with a plurality of through holes on a film layer provided with a plurality of opening patterns, each through hole enclosing at least one of the opening patterns, and by dividing one surface of the mask sheet into a plurality of unit cells each including two or more of the opening patterns and two or more of the plurality of through holes; and
   a sheet-shaped support member which is made of metal and has a plurality of openings corresponding to the unit cells of the mask sheet, the support member supporting the mask sheet by being joined to the metal layer of the mask sheet to which no external tension is applied,
   wherein:
   the metal layer is formed by plating on the film layer held in close contact by a substrate under such a condition as to generate internal tensile stress to the substrate, and the support member is joined to the metal layer, and the internal tensile stress remains in the metal layer.

2. The deposition mask according to claim 1, wherein the metal layer of the mask sheet and the support member are joined together by laser spot welding at least at a peripheral portion of each of the plurality of openings.

3. The deposition mask according to claim 2, wherein the metal layer is provided with a perforation for separating adjacent ones of the unit cells from each other along peripheries of the unit cells.

4. The deposition mask according to claim 2, wherein a frame is joined to the support member.

5. The deposition mask according to claim 3, wherein a frame is joined to the support member.

6. The deposition mask according to claim 1, wherein the metal layer is provided with a perforation for separating adjacent ones of the unit cells from each other along peripheries of the unit cells.

7. The deposition mask according to claim 6, wherein a frame is joined to the support member.

8. The deposition mask according to claim 1, wherein a frame is joined to the support member.

9. A method for manufacturing the deposition mask according to claim 1, comprising the steps of:
forming a mask sheet by sequentially stacking, on a transparent substrate, a film layer and a metal layer provided with a plurality of through holes, and by dividing one surface of the mask sheet into a plurality of unit cells each including two or more of the plurality of through holes, the metal layer being formed by plating on the film layer held in close contact by a substrate under such a condition as to generate internal tensile stress to the substrate;
joining a sheet-shaped support member to the metal layer of the mask sheet to which no external tension is applied, the support member being made of metal and having a plurality of openings corresponding to the unit cells;
forming at least one opening pattern in a portion of the film layer corresponding to each of the plurality of through holes by irradiating with a laser beam; and
stripping the transparent substrate from the mask sheet.

10. The method for manufacturing the deposition mask according to claim 9, wherein the steps of forming the mask sheet, joining the support member to the metal layer of the mask sheet, forming opening pattern in the film layer, and stripping the transparent substrate from the mask sheet are performed in this order.

11. The method for manufacturing the deposition mask according to claim 9, wherein the steps of forming the opening pattern in the film layer, forming the mask sheet, joining the support member to the metal layer of the mask sheet, and stripping the transparent substrate from the mask sheet are performed in this order.

12. The method for manufacturing the deposition mask according to claim 9, wherein the steps of forming the mask sheet, joining the support member to the metal layer of the mask sheet, stripping the transparent substrate from the mask sheet, and forming the opening pattern in the film layer are performed in this order.

13. The method for manufacturing the deposition mask according to claim 9, wherein the step of joining the support member to the metal layer of the mask sheet is performed by laser spot welding at least at a peripheral portion of each of the plurality of openings by irradiating the metal layer with a laser beam through the transparent substrate.

14. The method for manufacturing the deposition mask according to claim 9, wherein, before the step of stripping the transparent substrate, a frame is joined to a peripheral portion of the support member.

15. A method for repairing the deposition mask according to claim 1 which includes a mask sheet formed by stacking a metal layer provided with a plurality of through holes on a film layer provided with a plurality of opening patterns, each through hole enclosing at least one of the opening patterns, and by dividing one surface of the mask sheet into a plurality of unit cells each including two or more of the opening patterns and two or more of the plurality of through holes; and a sheet-shaped support member which is made of metal and has a plurality of openings corresponding to the unit cells of the mask sheet, the support member supporting the mask sheet by being joined to the metal layer of the mask sheet to which no external tension is applied,
wherein the metal layer is provided with a perforation for separating adjacent ones of the unit cells from each other along peripheries of the unit cells,
the method comprising the steps of:
removing a defective unit cell by cutting out a corresponding portion of the metal layer and the film layer along the perforation on a periphery of the defective unit cell;
fitting a unit mask member having a same shape as each of the unit cells into a space from which the defective unit cell has been removed, the unit mask member being formed by sequentially stacking a film layer and a metal layer having a plurality of through holes; and
forming an opening pattern within each of the plurality of through holes by irradiating the unit mask member with a laser beam from a surface of the metal layer.

* * * * *